United States Patent [19]
Duncombe et al.

[11] Patent Number: 6,054,328
[45] Date of Patent: Apr. 25, 2000

[54] METHOD FOR CLEANING THE SURFACE OF A DIELECTRIC

[75] Inventors: Peter R. Duncombe, Peekskill; David E. Kotecki, Hopewell Junction; Robert B. Laibowitz, Peekskill; Wesley Natzle, New Paltz; Chienfan Yu, Highland Mills, all of N.Y.

[73] Assignee: International Business Machines Corporation, Armonk, N.Y.

[21] Appl. No.: 08/761,166

[22] Filed: Dec. 6, 1996

[51] Int. Cl.⁷ .................................................. H01L 21/00
[52] U.S. Cl. ................................................. 438/3; 438/240
[58] Field of Search ............................... 438/3, 240, 238, 438/239, 253, 254, 396, 397

[56] References Cited

U.S. PATENT DOCUMENTS

| | | | |
|---|---|---|---|
| 4,075,040 | 2/1978 | Villain | 148/6.14 R |
| 5,181,985 | 1/1993 | Lampert et al. | 156/635 |
| 5,238,529 | 8/1993 | Douglas | 156/635 |
| 5,238,530 | 8/1993 | Douglas et al. | 156/654 |
| 5,282,925 | 2/1994 | Jeng et al. | 156/646 |
| 5,312,516 | 5/1994 | Douglas et al. | 156/635 |
| 5,374,330 | 12/1994 | Douglas | 156/635 |
| 5,391,393 | 2/1995 | Maniar | 438/3 |
| 5,439,845 | 8/1995 | Watanabe et al. | 438/3 |
| 5,466,332 | 11/1995 | Owen et al. | 156/630 |
| 5,466,629 | 11/1995 | Mihara et al. | 438/3 |
| 5,609,927 | 3/1997 | Summerfelt et al. | 427/553 |

*Primary Examiner*—Joni Chang
*Attorney, Agent, or Firm*—Tiffany L. Townsend

[57] ABSTRACT

This invention relates to a method for improving the chemical and electrical performance characteristics of a high dielectric constant material. The method comprises the steps of first obtaining a barium containing high dielectric constant material, the material having an upper surface and then modifying the surface chemistry of said upper surface by interacting said upper surface with a gas reactant in a closed environment. In a variant of the method, the gas reactant preferentially reacting with upper surface as compared to the bulk.

22 Claims, 1 Drawing Sheet

METHOD FOR CLEANING THE SURFACE OF A DIELECTRIC

FIELD OF INVENTION

The present invention relates to high dielectric capacitors which are useful in semiconductor devices. More particularly, the present invention relates to a method for producing high quality capacitors, as well as the structure of such capacitors.

BACKGROUND OF INVENTION

Materials having a permittivity of at least 20 are important for use in capacitors for advanced DRAMs such as the 1 Gbit generation and beyond. However, it has not been easy to maximize the overall storage charge of capacitors containing high dielectric constant materials. Events that occur during the fabrication process can reduce the final overall charge storage capability of the capacitor.

Capacitor performance can be increased by reducing the capacitor leakage current. Leakage current is a stray current which flows across the surface of a high dielectric constant capacitor or alternatively through the capacitor.

Leakage currents can cause unpredictable and detrimental changes in circuit conditions. It is therefore advantageous to reduce leakage currents in circuits. Thermal cycling is one way to reduce leakage currents. In thermal cycling, the high dielectric constant capacitor is heated to a critical temperature either before or after the overlying metallic layer is applied. Thermal cycling can also lead to increased adherence of the overlying metallic layer.

Additionally, new high dielectric constant material are being actively sought for the next generation of DRAM capacitors. Perovskites are an important class of high dielectric constant materials. Perovskites can be ferroelectrics and have a crystalline structure. Members of the perovskite family include $BaTiO_3$, $SrTiO_3$, $LiNbO_3$ and $(Ba,Sr)TiO_3$. $(Ba,Sr)TiO_3$ is a titanate that contains a mixture of barium, Ba, and strontium, Sr, and is also known as BST.

Overall storage capacity can be effected in different ways. Interfacial layers between the high dielectric layer and the electrodes can reduce the effective capacitive potential of a high dielectric constant material by providing a leakage path. There are a number of ways that a detrimental interfacial layer could be formed. The interfacial layer could be produced by a reaction of a previously deposited electrode with the process chemistry during the deposition of the high dielectric layer. Alternatively, the interfacial layer could be formed by a residual layer left at the surface of the high dielectric layer after its deposition or the layer could be a single monolayer or less of contaminants formed on the surface of the high dielectric layer.

The control of capacitance across an interfacial area between two electrodes is important because the interfacial area contributes to series capacitance. The total capacitance of the area between the two electrodes is given by the equation $C=\epsilon_0\epsilon_r A/d$; where $\epsilon_0$ is the permittivity of free space, $\epsilon_r$ is the relative permittivity of the dielectric material, A is the area and d is the separation between electrodes. When an interfacial area consists of more than one layer, the different layers all contribute to the overall capacitance.

When the dielectric constants of the layers comprising the interfacial area between two electrodes are not equal, each layer contributes to the determination of $\epsilon_r$, the relative permittivity of the high dielectric constant material. The variable $\epsilon_r$ is related to the relative permittivities and thicknesses of the layers between the two electrodes and is represented by the equation: $1/\epsilon_r/d=1/\epsilon_{r1}/d_1+1/\epsilon_{r2}/d_2$. Therefore it is desirable to maximize the dielectric constant for each layer since each layer contributes to the overall dielectric constant of the interfacial area.

One way to reduce interfacial interference at a surface is to clean the surface prior to electrode introduction. Many different methods exist to clean semi conductor component materials. Wet and dry pre-electrode deposition cleaning methods are known in the art but tend to be material specific. While pre-electrode cleaning solutions and methods do exist for other materials, there is no teaching of a method of increasing the overall performance of a high dielectric constant material that substantially modifies only the surface of a constituent material.

Thus there remains a need for improved performance of a high dielectric constant capacitive materials such that the overall performance of the material is maximized, the surface layer of a constituent material is affected, and the leakage current is reduced.

SUMMARY OF THE INVENTION

It is therefore an object of the present invention to provide a surface cleaning method for high dielectric constant capacitive materials.

It is a further object of the invention to provide a cleaning method that does not materially affect the characteristics of a barium containing constituent material beneath the surface layer of the barium containing high dielectric constant material.

It is another objective of the invention to provide a method for altering the surface chemistry of a high dielectric capacitive material without materially affecting the chemistry of the bulk constituent.

It is yet another objective of this invention to provide a method of maximizing the overall capacitance of a high dielectric material.

It is still another object of the invention to create a$(Ba, Sr)TiO_3$ surface that is more conducive to electrode deposition.

It is additionally an objective of the invention to employ a chemistry reactive with the surface layer but not reactive with the bulk constituent of the high dielectric constant capacitive material.

The above listed and other objects are achieved by providing a method of forming high dielectric capacitors comprising the steps of first obtaining a barium containing high dielectric constant material, and second modifying the surface chemistry of said barium containing high dielectric constant material by interacting said barium containing high dielectric constant material with a gas reactant in a closed environment.

BRIEF DESCRIPTION OF THE DRAWINGS

These and other features, aspects, and advantages will be more readily apparent and better understood from the following detailed description of the invention, in which.

DETAILED DESCRIPTION OF THE INVENTION

Figure 1:
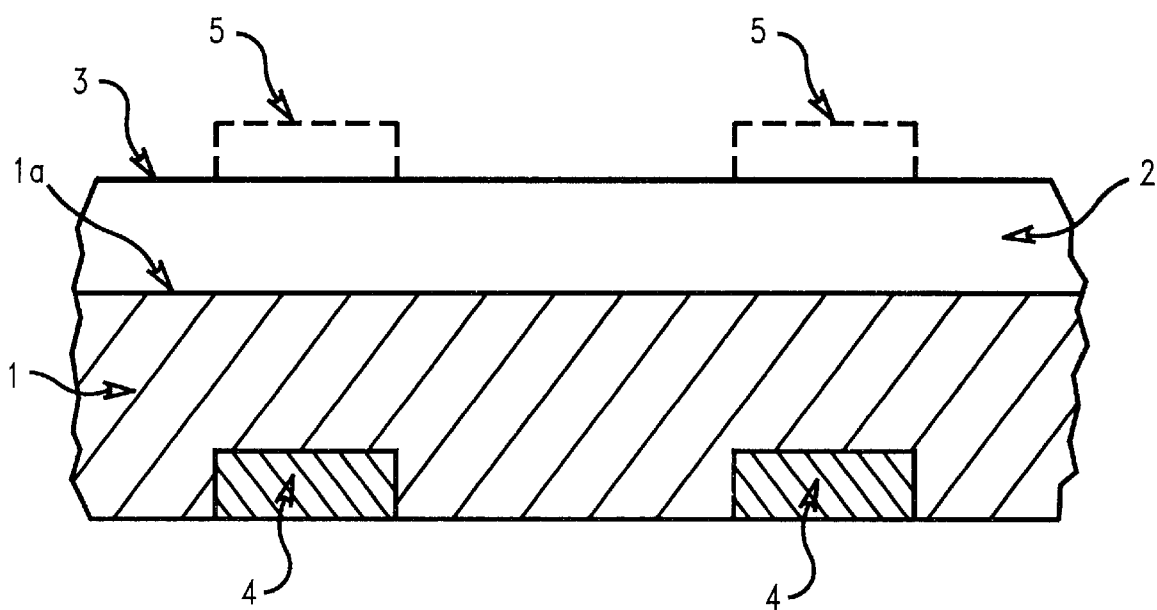
FIG. 1 is a cross-sectional view of the high dielectric constant material, including the underlying structures.

The present invention sets forth a technique for maximizing the performance of capacitors, the capacitors containing dielectric constant materials with a high permittivity, $\epsilon > 20$. In particular, the present invention provides a technique for producing capacitors having permittivities in the hundreds.

The present invention has found that the dielectric constant of a capacitive material can be improved if the dielectric material is treated before deposition of overlying layers. Specifically, the present invention treats the surface of the high dielectric constant material before applying the overlying metallic layer. This treatment is such as to remove any unwanted oxides on the surface and/or to modify the surface of the dielectric to improve the performance.

The method of the invention can also reduce leakage currents in high permittivity material. The method of the present invention also effectively modifies the interfacial surface of a high dielectric constant capacitor without materially affecting the consistency or properties of the substrate as a whole.

In the present invention, shown in FIG. 1, the constituent layer $(Ba,Sr)TiO_3$ is a first layer, 2, and the surface of the constituent $(Ba,Sr)TiO_3$, 3, is a second layer. The surface must be considered a second layer because the chemical and electrical characteristics of the surface are markedly dissimilar to the constituent material. The surface layer, 3, can be composed of material of atomic composition other than Ba, Sr, Ti, and O, or can be composed of Ba, Sr, Ti and O but with a composition different than the underlying material. Alternatively, the surface layer can have the same composition as the underlying $(Ba,Sr)TiO_3$ but have an undesired atom on the surface. In order to increase the overall dielectric constant it is therefore necessary to maximize the dielectric constant of both the first and second layer.

The present invention teaches a process whereby a dielectric surface treatment is performed on the high dielectric constant material prior to depositing subsequent layers on the high dielectric constant material. A dielectric surface treatment can consist of a single dielectric surface cleaning step. In a dielectric surface cleaning step, a gas reactant is introduced into a reactor containing the untreated capacitive material. The gas reactant is allowed to interact chemically with the surface of the high dielectric constant capacitive material and the gas is then extracted from the reactor.

The increase in the capacitance of the $(Ba,Sr)TiO_3$ layer, 3, is shown in Table 1 below. The increases shown are significant.

TABLE 1

|  | No Treatment C/A avg/ max | After Treatment C/A avg/ max |
| --- | --- | --- |
| Sample 1 | 42/ 45 | 48/ 51 |
| Sample 2 | 14/ 16 | 23/ 25 |
| Sample 3 | 37/ 39 | 48/ 59 |

The treatment described in this embodiment removes at most 3–15 angstroms of material from the surface of the high dielectric constant material being treated. The constituent material below the surface is substantially unaffected by the treatment.

The surface barium is effected by the dielectric surface treatment, as shown in Table 2. The concentration of surface barium is reduced. The data was accumulated using a number of diagnostic tools, including Auger analysis.

TABLE 2

|  |  | Ba + Surface | Ba + Constituent |
| --- | --- | --- | --- |
| Sample 1 | Treated | 6 | 15 |
|  | Control | 19 | 22 |
| Sample 2 | Treated | 6 | 16 |
|  | Control | 20 | 24 |
| Sample 3 | Treated | 8 | 12 |
|  | Control | 20 | 20 |
| Sample 4 | Treated | 8 | 15 |
|  | Control | 19 | 19 |

As shown by table 2, the constituent barium was substantially uneffected by the dielectric surface treatment while there was approximately a 30% reduction in the concentration of surface barium. Repeated treatments show that the surface was preferentially etched, thus eliminating the need to carefully time the etch.

An important feature of our invention is that a gas is used to react with the surface layer. The use of a gas enables a reaction that is preferred over a similar reaction in solution. For instance, if HF in solution is employed to remove the surface layer of BST, then reaction and dissolution takes place in a single step. Since the bulk $(Ba,Sr)TiO_3$ is soluble in a HF solution, it is difficult to react with just the surface layer. When gaseous HF alone is employed in the dielectric surface treatment, the reaction step can be carried out without dissolution. A second step, with water and no dissolved HF, can be employed to carry out dissolution of the reacted layer without significant additional reaction. The surface layer, 3 in FIG. 1, which is to be improved, is attacked and removed without substantial attack or removal of the underlying, constituent material.

In a preferred embodiment, shown in FIG. 1, a $(Ba,Sr)TiO_3$ layer, 2, is deposited on an upper surface, 1a of a substrate, Pt, layer, 1 on a wafer. The substrate, Pt, was deposited after the creation underlying electrodes, 4. According to the invention, the etchant and process of the present invention are viable whether the BST layer is patterned or not.

In this case the BST surface is deposited by chemical vapor deposition. The etched surface is an upper surface of the barium containing high dielectric constant material and is shown as, 3, in FIG. 1. The wafer containing the etched surface is introduced into a reactor capable of supplying a gas reactant. A dielectric surface cleaning step is then performed. In a preferred embodiment, a dielectric surface treatment consists of at least one dielectric surface cleaning step. In a more preferred embodiment the dielectric surface cleaning step is then followed by a rinse and dried using a drying means. In a most preferred embodiment, the dielectric surface treatment consists of a dielectric surface cleaning step/rinse/drying followed by a second dielectric surface cleaning step/rinse/drying.

The drying means can consist of any drying method known in the art. In a preferred embodiment, the drying means is a spin dry, a blow dry or a combination thereof.

In a preferred embodiment, the gas reactant is HF. In a more preferred embodiment the gas reactant is a mixture of HF and $NH_3$. The gas reactant can be introduced into the chamber in a number of ways. The source could be separate gaseous sources of HF and $NH_3$. Alternatively, the gas reactant could be in the form of a plasma discharge in precursor gases that decompose to produce appropriate levels of HF and $NH_3$. For example, $NF_3$ and $H_2$ produce HF and $NH_3$. The discharge could be in the same chamber but would preferably be upstream of the chamber.

In a most preferred embodiment, the dielectric surface treatment consists of a flow of gas sublimed from solid $NH_5F_2$, introduced into the reactor at 10 mTorr for about 1 minute. The $NH_5F_2$ vapor would be in the proportion of about two parts HF and about one part $NH_3$. A rinse containing deionized $H_2O$ is then performed and the wafer is spun dry.

In an even more preferred embodiment the dielectric surface treatment is performed twice. The high dielectric constant material is then heated to 275° C. thereby reducing current leakage and promoting increased adherence. An overlying metallic layer, 5, is then deposited while the temperature is elevated.

An example of process conditions is given here to illustrate potential process parameters. Other configurations are possible and would be obvious to one skilled in the art and the use of alternative configurations not shown in the example would violate the scope and the spirit of the process.

EXAMPLE

The wafer would be subjected to the following steps: 1) The BST wafer would be placed in a reactor; 2) The flow of HF and NH3 would be introduced into the reactor upstream from the BST wafer; 3)The wafer would be exposed to HF and $NH_3$ for a time between 2 minutes 20 seconds and 40 minutes and the reactor would have a temperature set at 23° C. and a pressure of 10 mTorr; 4)The wafer would then be rinsed with deionized water at 23° C. for 2 minutes; 5) The wafer would then be spun dry. Steps 1–5 would be repeated a second time.

In alternative embodiments of the invention, a dielectric surface treatment can be used to either introduce a non-constituent element to the surface only of the high dielectric constant material which enhances the functioning of the high dielectric constant material or remove non-bulk contaminants from the surface of the high dielectric constant material.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed:

1. A method of forming high dielectric capacitors comprising:
    (a) obtaining a barium containing high dielectric constant material, the barium containing high dielectric constant material having an upper surface and a bulk; and
    (b) modifying the surface chemistry of said upper surface by interacting said upper surface with a gas reactant in a closed environment.

2. The method of claim 1 wherein the gas reactant interacts preferentially with said upper surface compared to the bulk.

3. The method of claim 1 further comprising the steps of first rinsing said upper surface and then drying said upper surface using a drying means following the step of interacting said upper surface with said gas reactant in a closed environment.

4. The method of claim 3 further comprising the steps of interacting said upper surface with a gas reactant in a closed environment a second time followed by the steps of rinsing said upper surface a second time and then using a drying means to dry said upper surface a second time.

5. The method of claim 3 wherein said rinsing uses deionized $H_2O$ and said drying means is one of a blow dry, a spin dry and a combination thereof.

6. The method of claim 4 wherein said first rinsing uses deionized $H_2O$ and said first drying means is one of a blow dry, a spin dry and a combination thereof; and said second rinse uses deionized $H_2O$, and said second drying means is one of a blow dry, a spin dry and a combination thereof.

7. The method of claim 1 wherein said gas reactant comprises HF.

8. The method of claim 1 wherein said gas reactant comprises a mixture of HF and $NH_3$.

9. The method of claim 1 further comprising the step of heating the barium containing high dielectric constant material to at least 275° C. after interacting said upper surface with a gas reactant in a closed environment.

10. The method of claim 1 wherein the high dielectric constant material is selected from the group consisting of $(Ba,Sr)TiO_3$ and $BaTiO_3$.

11. The method of claim 10 wherein the high dielectric constant material is $(Ba,Sr)TiO_3$.

12. A method of forming high dielectric capacitors, comprising:
    a) obtaining a barium containing high dielectric constant material, the barium containing high dielectric material having a upper surface and a bulk, the high dielectric material containing at least one constituent; and
    b) modifying the surface chemistry of said upper surface by interacting said upper surface with a gas reactant in a closed environment such that the concentration of at least one constituent of the high dielectric material at the upper surface is changed with respect to the concentration of the at least one constituent in the bulk.

13. The method of claim 12 wherein the gas reactant interacts preferentially with said upper surface compared to the bulk.

14. The method of claim 12 further comprising the steps of first rinsing said upper surface and then drying said upper surface using a drying means following the step of interacting said upper surface with said gas reactant in a closed environment.

15. The method of claim 14 further comprising the steps of interacting said upper surface with a gas reactant in a closed environment a second time followed by the steps of rinsing said upper surface a second time and then using a drying means to dry said upper surface a second time.

16. The method of claim 14 wherein said rinsing uses deionized $H_2O$ and said drying means is one of a blow dry, a spin dry and a combination thereof.

17. The method of claim 15 wherein said first rinsing uses deionized $H_2O$ and said first drying means is one of a blow dry, a spin dry and a combination thereof; and said second rinse uses deionized $H_2O$, and said second drying means is one of a blow dry, a spin dry and a combination thereof.

18. The method of claim 12 wherein said gas reactant comprises HF.

19. The method of claim 12 wherein said gas reactant comprises a mixture of HF and $NH_3$.

20. The method of claim 12 further comprising the step of heating the barium containing high dielectric constant material to at least 275° C. after interacting said upper surface with a gas reactant in a closed environment.

21. The method of claim 12 wherein the high dielectric constant material is selected from the group consisting of $(Ba,Sr)TiO_3$ and $BaTiO_3$.

22. The method of claim 21 wherein the high dielectric constant material is $(Ba,Sr)TiO_3$.

* * * * *